United States Patent
Chang

(10) Patent No.: US 8,665,659 B2
(45) Date of Patent: Mar. 4, 2014

(54) DATA TRANSMISSION CIRCUIT

(75) Inventor: Min Chang, Seoul (KR)

(73) Assignee: SK Hynix Inc., Gyeonggi-do (KR)

( * ) Notice: Subject to any disclaimer, the term of this patent is extended or adjusted under 35 U.S.C. 154(b) by 146 days.

(21) Appl. No.: 13/336,702

(22) Filed: Dec. 23, 2011

(65) Prior Publication Data

US 2013/0114362 A1 May 9, 2013

(30) Foreign Application Priority Data

Nov. 4, 2011 (KR) .................. 10-2011-0114798

(51) Int. Cl.
*G11C 7/02* (2006.01)
(52) U.S. Cl.
USPC .............................. 365/207; 365/205; 365/204
(58) Field of Classification Search
USPC .......................................... 365/207, 205, 194
See application file for complete search history.

(56) References Cited

U.S. PATENT DOCUMENTS

| | | | | |
|---|---|---|---|---|
| 6,009,030 | A | * 12/1999 | Seo | ........... 365/205 |
| 6,906,558 | B2 | * 6/2005 | Lee et al. | ........... 327/57 |
| 7,986,574 | B2 | * 7/2011 | Lee | ........... 365/194 |
| 2010/0091580 | A1 | 4/2010 | Kim | |

FOREIGN PATENT DOCUMENTS

| | | |
|---|---|---|
| KR | 100842919 B1 | 6/2008 |
| KR | 100909800 B1 | 7/2009 |

* cited by examiner

*Primary Examiner* — Connie Yoha
(74) *Attorney, Agent, or Firm* — William Park & Associates Patent Ltd.

(57) ABSTRACT

A data transmission circuit includes an enable signal generation unit configured to receive a first enable signal and generate a second enable signal having a pulse width controlled according to a swing width of data inputted through a first data line, and a sense amplification unit configured to sense and amplify the data inputted through the first data line in response to the second enable signal, and transmit the amplified data to a second data line.

15 Claims, 3 Drawing Sheets

DATA TRANSMISSION CIRCUIT

CROSS-REFERENCES TO RELATED APPLICATIONS

The present application claims priority under 35 U.S.C 119(a) to Korean Application No. 10-2011-0114798, filed on Nov. 4, 2011 in the Korean intellectual property Office, which is incorporated by reference in its entirety.

BACKGROUND

A semiconductor memory device stores data through a write operation, and outputs stored data through a read operation. When a write or read operation is performed, data inputted to or outputted from the semiconductor memory device is gradually attenuated by line loading of a data line. When the data is severely attenuated, the data may be distorted. Therefore, a circuit is required to restore the attenuated data. Therefore, the semiconductor memory device includes a sense amplifier circuit to sense and amplify the data transmitted through the data line and transmit the amplified data to another data line.

The sense amplifier circuit used in the semiconductor memory device may include an input/output sense amplifier (IOSA). In general, the IOSA is implemented as a cross-coupled latch type and configured to sense and amplify data transmitted through an input data line and transmit the amplified data to an output data line. The data transmission operation of the IOSA is performed during an enable period set by an enable signal. The enable period is set to a pulse width of the enable signal, that is, a period in which the enable signal is at logic high level (or logic low level depending on embodiments).

However, the pulse width of the enable signal for controlling the operation of the IOSA is constant regardless of a swing width of data transmitted through the input data line. Therefore, a problem may occur in timing margin and current consumption. That is, as the swing width of the data transmitted through the input data line decreases, a time required for turning on PMOS and NMOS transistors included in the IOSA increases. Therefore, it is difficult to sufficiently secure a timing margin for transmitting data from the input data line to the output data line. The insufficiency of the timing margin becomes more severe during high-speed operation. Furthermore, as the swing width of the data transmitted through the input data line increases, the time required for turning on the PMOS and NMOS transistors included in the IOSA decreases. Therefore, even after the data is transmitted from the input data line to the output data line, the operation of the IOSA continues to cause current consumption.

SUMMARY

An embodiment of the present invention relates to a data transmission circuit capable of securing a timing margin during a high-speed operation and reducing current consumption by controlling a period in which data is sensed and amplified according to a swing width of the data transmitted through a data line.

In one embodiment, a data transmission circuit includes an enable signal generation unit configured to receive a first enable signal and generate a second enable signal having a pulse width controlled according to a swing width of data inputted through a first data line, and a sense amplification unit configured to sense and amplify the data inputted through the first data line in response to the second enable signal, and transmit the amplified data to a second data line.

In another embodiment, a data transmission circuit includes a pulse width control section configured to generate a second enable signal having a pulse width controlled in response to first and second detection signals when a first enable signal is enabled, and a sense amplification section configured to sense and amplify data inputted through a first data line in response to the second enable signal and transmit the amplified data to a second data line.

In another embodiment, a second enable signal correlated to a received first enable signal may be generated, where a pulse width of the second enable signal is controlled according to a swing width of a first data. The first data may then be sensed and amplified in response to the second enable signal, and the amplified first data may be transmitted.

BRIEF DESCRIPTION OF THE DRAWINGS

The above and other aspects, features, and advantages will be more clearly understood from the following detailed description taken in conjunction with the accompanying drawings.

DESCRIPTION OF SPECIFIC EMBODIMENTS

Embodiments of the present invention will be described with reference to accompanying drawings. However, the embodiments are for illustrative purposes only and are not intended to limit the scope of the invention.

Figure 1:
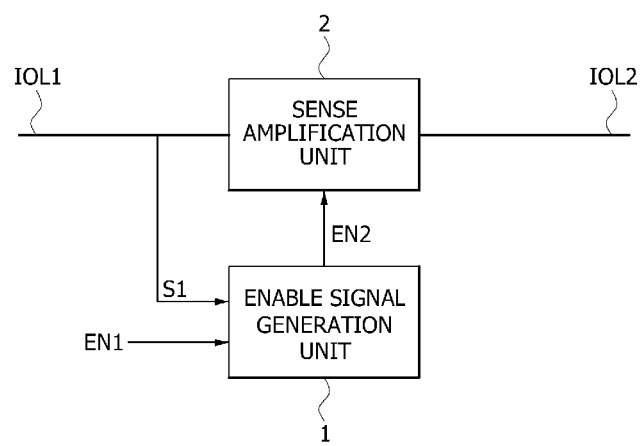
FIG. 1 is a block diagram illustrating a configuration of an exemplary data transmission circuit in accordance with an embodiment of the present invention.

FIG. 1 is a block diagram illustrating a configuration of an exemplary data transmission circuit in accordance with an embodiment of the present invention.

Referring to FIG. 1, the data transmission circuit in accordance with an embodiment of the present invention includes an enable signal generation unit 1 and a sense amplification unit 2. The enable signal generation unit 1 is configured to receive a first enable signal EN1 and generate a second enable signal EN2 having a pulse width controlled according to a swing width of data S1 inputted through a first data line IOL1. The sense amplification unit 2 is configured to sense and amplify the data S1 in response to a second enable signal EN2 and transmit the amplified data to a second data line 10L2. The sense amplification unit 2 performs an operation of sensing and amplifying the data S1 when the second enable signal EN2 is asserted to a logic high level. Therefore, as the pulse width of the second enable signal EN2 increases, the sense amplification unit 2 continues the sense amplification operation of the data S1 for a longer time. The first enable signal EN1 is asserted to a logic high level during a preset period such that the data S1 is transmitted from the first data line IOL1 to the second data line 10L2. Various embodiments of the invention may also assert signals to a logic low level. The specific level of an asserted signal may be design dependent.

Figure 2:
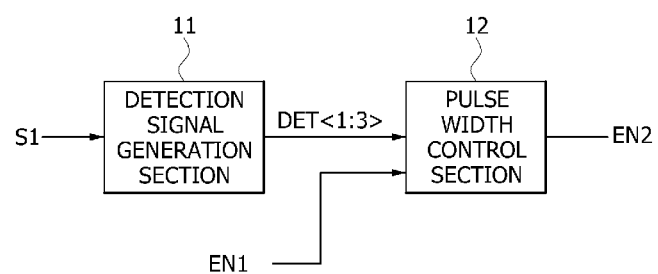
FIG. 2 is a block diagram illustrating a configuration of an exemplary enable signal generation unit of FIG. 1.
Figure 3:
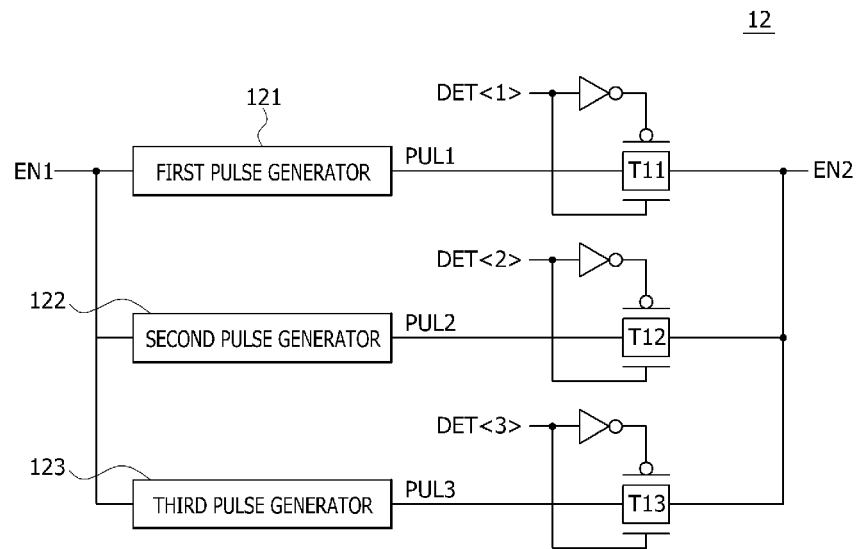
FIG. 3 is a circuit diagram of an exemplary pulse width control section included in the enable signal generation unit of FIG. 1.

Referring to FIGS. 2 and 3, the configuration of the exemplary enable signal generation unit 1 will be described in more detail as follows.

Referring to FIG. 2, the enable signal generation unit 1 includes a detection signal generation section 11 and a pulse width control section 12. The detection signal generation section 11 is configured to generate first to third detection signals DET<1:3> that are selectively enabled according to the swing width of the data S1 inputted through the first data line IOL1. The pulse width control section 12 is configured to generate the second enable signal EN2 having a pulse width controlled in response to the first to third detection signals DET<1:3>. This may occur during a state where the first enable signal EN1 is asserted to a logic high level.

Referring to FIG. 3, the exemplary pulse width control section 12 includes a first pulse generator 121, a second pulse generator 122, a third pulse generator 123, a first transmission element T11, a second transmission element T12, and a third transmission element T13. The first pulse generator 121 is configured to generate a first pulse PUL1 having a first pulse width when the first enable signal EN1 asserted to a logic high level is inputted. The second pulse generator 122 is configured to generate a second pulse PUL2 having a second pulse width when the first enable signal EN1 asserted to a logic high level is inputted. The third pulse generator 123 is configured to generate a third pulse PUL3 having a third pulse width when the first enable signal EN1 asserted to a logic high level is inputted. The first transmission element T11 is configured to transmit the first pulse PUL1 as the second enable signal EN2 when the first detection signal DET1 is at a logic high level. The second transmission element T12 is configured to transmit the second pulse PUL2 as the second enable signal EN2 when the second detection signal DET2 is at a logic high level. The third transmission element T13 is configured to transmit the third pulse PUL3 as the second enable signal EN2 when the third detection signal DET3 is at a logic high level. The third pulse width may be larger than the second pulse width, and the second pulse width may be larger than the first pulse width.

Figure 4:
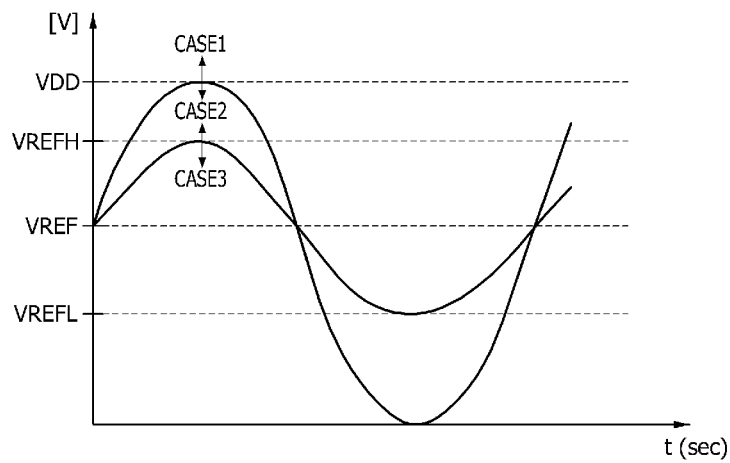
FIGS. 4 and 5 are diagrams explaining the operation of the data transmission circuit of FIG. 1.
Figure 5:
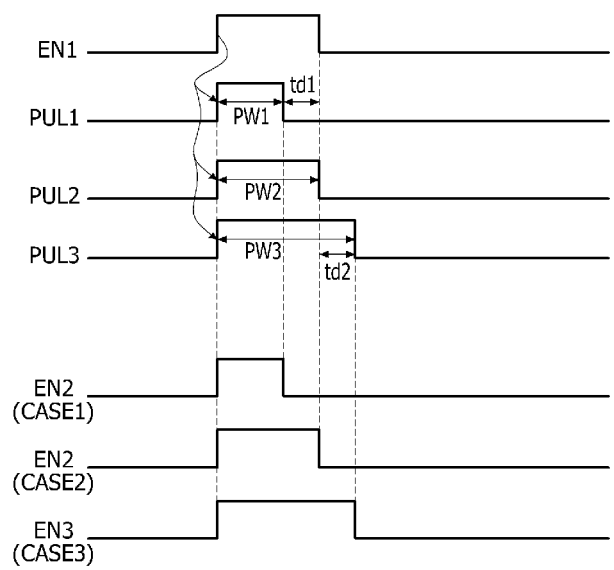

Referring to FIGS. 4 and 5, the operation of the data transmission circuit configured in the above-described manner will be described in detail as follows.

First, the detection signal generation section 11 generates the first to third detection signals DET<1:3> which are selectively enabled according to the swing width of the data S1 inputted through the first data line IOL1. More specifically, referring to FIG. 4, when the swing width of the data S1 is larger than the power supply voltage VDD (CASE1), the detection signal generation section 11 generates the first detection signal DET<1> asserted to a logic high level and the second and third detection signals DET<2:3> deasserted to a logic low level. When the swing width of the data S1 is smaller than the power supply voltage VDD but larger than a difference between an upper-limit reference voltage VREFH and a lower-limit reference voltage VREFL (CASE2), the detection signal generation section 11 generates the second detection signal DET<2> asserted to a logic high level and the first and third detection signals DET<1, 3> deasserted to a logic low level. When the swing width of the data S1 is smaller than a difference between the upper-limit reference voltage VREFH and the lower-limit reference voltage VREFL (CASE3), the detection signal generation section 11 generates the third detection signal DET<3> asserted to a logic high level and the first and second detection signals DET<1:2> deasserted to a logic low level.

The pulse width control section 12 generates the second enable signal EN2 having a pulse width controlled in response to the first to third detection signals DET<1:3> during the time when the first enable signal EN1 is asserted to a logic high level. More specifically, referring to FIG. 5, when the first enable signal EN1 is asserted to a logic high level, the first pulse PUL1 having a first pulse width PW1 is generated, the second pulse PUL2 having a second pulse width PW2 is generated, and the third pulse PUL3 having a third pulse width PW3 is generated. The second pulse width PW2 is set to a value larger by td1 than the first pulse width PW1, and the third pulse width PW3 is set to a value larger by td2 than the second pulse width PW2. The pulse width of the second enable signal EN2 is decided by the first to third pulses PUL1 to PUL3 generated in such a manner. In the first case CASE1, the first pulse PUL1 is outputted as the second enable signal EN2. In the second case CASE2, the second pulse PUL2 is outputted as the second enable signal EN2. In the third case CASE3, the third pulse PUL3 is outputted as the second enable signal EN2.

The sense amplification unit 2 performs an operation of sensing and amplifying the data S1 when the second enable signal EN2 is at a logic high level. Therefore, the sense and amplification unit 2 senses and amplifies the data S1 during the first pulse width PW1 in the first case CASE1, senses and amplifies the data S2 during the second pulse width PW2 in the second case CASE2, and senses and amplifies the data S1 during the third pulse width PW3 in the third case CASE3.

When the swing width of the data S1 inputted through the first data line IOL1 is small, the data transmission circuit in accordance with an embodiment of the present invention increases the period where the data S1 is sensed and amplified, thereby sufficiently secures a timing margin required for transmitting data during a high-speed operation. When the swing width of the data S1 inputted through the first data line IOL1 is large, the data transmission circuit in accordance with an embodiment of the present invention reduces the period where the data S1 is sensed and amplified, thereby substantially preventing unnecessary current consumption.

Various embodiments of the present invention have been disclosed above for illustrative purposes. Those skilled in the art will appreciate that various modifications, additions, and substitutions are possible without departing from the scope and spirit of the invention as disclosed in the accompanying claims.

What is claimed:

1. A data transmission circuit comprising:
   a detection signal generation section configured to generate a detection signal which is selectively asserted according to the swing width of the data inputted through the first data line;
   a pulse width control section configured to generate the second enable signal having a pulse width controlled in response to the detection signal during a period when the first enable signal is asserted; and
   a sense amplification unit configured to sense and amplify the data inputted through the first data line in response to the second enable signal, and transmit the amplified data to a second data line,
   wherein the detection signal generation section asserts a first detection signal when the swing width of the data is larger than a first level, and asserts a second detection signal when the swing width of the data is smaller than the first level and larger than a second level.

2. The data transmission circuit of claim 1, wherein the pulse width control section generates the second enable signal having a first pulse width when the first detection signal is asserted, and generates the second enable signal having a second pulse width when the second detection signal is asserted.

3. The data transmission circuit of claim 2, wherein the second pulse width is larger than the first pulse width.

4. The data transmission circuit of claim 2, wherein the pulse width control section comprises:
    a first pulse generator configured to selectively generate a first pulse having the first pulse width when the first enable signal is asserted;
    a second pulse generator configured to selectively generate a second pulse having the second pulse width when the first enable signal is asserted;
    a first transmission element configured to transmit the first pulse as the second enable signal in response to the first detection signal; and
    a second transmission element configured to transmit the second pulse as the second enable signal in response to the second detection signal.

5. The data transmission circuit of claim 4, wherein the second pulse width is larger than the first pulse width.

6. A data transmission circuit comprising:
    a pulse width control section configured to generate a second enable signal having a pulse width controlled in response to first and second detection signals when a first enable signal is asserted; and
    a sense amplification section configured to sense and amplify data inputted through a first data line in response to the second enable signal and transmit the amplified data to a second data line,
    wherein the first detection signal is asserted when a swing width of the data inputted through the first data line is larger than a first level.

7. The data transmission circuit of claim 6, wherein the second detection signal is asserted when the swing width of the data is smaller than the first level and larger than a second level.

8. The data transmission circuit of claim 6, wherein the pulse width control section generates the second enable signal having a first pulse width when the first detection signal is asserted, and generates the second enable signal having a second pulse width when the second detection signal is asserted.

9. The data transmission circuit of claim 8, wherein the second pulse width is larger than the first pulse width.

10. The data transmission circuit of claim 8, wherein the pulse width control section comprises:
    a first pulse generator configured to selectively generate a first pulse having the first pulse width when the first enable signal is asserted;
    a second pulse generator configured to selectively generate a second pulse having the second pulse width when the first enable signal is asserted;
    a first transmission element configured to transmit the first pulse as the second enable signal in response to the first detection signal; and
    a second transmission element configured to transmit the second pulse as the second enable signal in response to the second detection signal.

11. The data transmission circuit of claim 10, wherein the second pulse width is larger than the first pulse width.

12. A method comprising:
    selectively asserting one of a plurality of detection signals according to the swing width of the first data;
    generating the second enable signal whose pulse width is controlled in response to the plurality of detection signal during a period when the first enable signal is asserted;
    sensing and amplifying the first data in response to the second enable signal; and
    transmitting the amplified first data,
    wherein a first of the plurality of the detection signals is asserted when the swing width of the first data is larger than a first level, and a second of the plurality of the detection signals is asserted when the swing width of the data is smaller than the first level and larger than a second level.

13. The method of claim 12, wherein the second enable signal having a first pulse width is generated when the first of the plurality of the detection signals is asserted, and the second enable signal having a second pulse width is generated when the second of the plurality of the detection signals is asserted.

14. The method of claim 13, wherein the second pulse width is larger than the first pulse width.

15. The method of claim 13, comprising:
    selectively generating a first pulse having the first pulse width when the first enable signal is asserted;
    selectively generating a second pulse having the second pulse width when the first enable signal is asserted;
    transmitting the first pulse as the second enable signal in response to the first detection signal; and
    transmitting the second pulse as the second enable signal in response to the second detection signal.

* * * * *